United States Patent [19]
Mikagi

[11] Patent Number: 6,107,096
[45] Date of Patent: Aug. 22, 2000

[54] METHOD OF FABRICATING A SALICIDE-STRUCTURED MOS SEMICONDUCTOR DEVICE HAVING A COBALT DISILICIED FILM

[75] Inventor: Kaoru Mikagi, Tokyo, Japan

[73] Assignee: NEC Corporation, Tokyo, Japan

[21] Appl. No.: 08/625,546

[22] Filed: Apr. 1, 1996

[30] Foreign Application Priority Data

Mar. 30, 1995 [JP] Japan ................................. 7-073105

[51] Int. Cl.⁷ .................. H01L 21/3205; H01L 21/4763
[52] U.S. Cl. .................. 435/586; 438/655; 438/664; 438/676; 438/677; 438/681; 438/683
[58] Field of Search .................. 438/586, 655, 438/664, 676, 677, 681, 683, FOR 360

[56] References Cited

U.S. PATENT DOCUMENTS

| | | |
|---|---|---|
| 4,378,628 | 4/1983 | Levinstein et al. . |
| 4,663,191 | 5/1987 | Choi et al. ................................. 427/93 |
| 5,089,441 | 2/1992 | Moslehi ................................. 437/225 |
| 5,130,172 | 7/1992 | Hicks et al. ............................. 427/252 |
| 5,292,393 | 3/1994 | Maydan et al. ......................... 156/345 |
| 5,403,620 | 4/1995 | Kaesz et al. ............................. 427/252 |

FOREIGN PATENT DOCUMENTS

| | | |
|---|---|---|
| 63-65666 | 3/1988 | Japan . |
| 3-234062 | 10/1991 | Japan . |
| 5-211134 | 8/1993 | Japan . |
| 6-89874 | 3/1994 | Japan . |
| 6-124959 | 5/1994 | Japan . |
| 6-132243 | 5/1994 | Japan . |
| 6-232097 | 8/1994 | Japan . |

OTHER PUBLICATIONS

VMIC Conference, 1992, pp 267–273.
VMIC Conference, 1990, pp 233–239.
IEDM Technical Digest, 1994, pp 687–690.
Wolf, Stanley, Silicon Processing for the VLSI Era, vol. 2, Process integration, pp. 144–152, 1990.

*Primary Examiner*—Bennett Celsa

[57] ABSTRACT

The present invention provides a method of fabricating a semiconductor device, including the steps of (a) forming a gate electrode in device formation regions on a semiconductor substrate having first conductivity, (b) forming diffusion layers in the device formation regions, the diffusion layers having second conductivity, (c) removing naturally oxidized films having been formed on both the diffusion layers and the gate electrode, in vacuum condition, (d) selectively forming cobalt films on both the diffusion layers and the gate electrode by chemical vapor deposition using gas produced by gasifying cobalt organic compound, (e) carrying out thermal annealing to selectively form cobalt disilicide ($CoSi_2$) films on both the diffusion layers and the gate electrode, the semiconductor substrate being maintained in vacuum condition during the steps (c) to (e), and (f) forming metal wirings in electrical connection with both the diffusion layers and the gate electrode with an interlayer insulating film sandwiched therebetween. The method makes it possible to form high purity thin cobalt films having uniform thickness with high reproducibility, and to prevent both increased leak current across PN junction in the diffusion layers after the formation of cobalt disilicide ($CoSi_2$) films and decreasing of break down voltage of PN junction.

19 Claims, 3 Drawing Sheets

METHOD OF FABRICATING A SALICIDE-STRUCTURED MOS SEMICONDUCTOR DEVICE HAVING A COBALT DISILICIED FILM

BACKGROUND OF THE INVENTION

Field of the Invention

The invention relates to a method of fabricating a semiconductor device, and more particularly to a method of fabricating a salicide-structured MOS semiconductor device by using a cobalt disilicide ($CoSi_2$) film.

DESCRIPTION OF THE RELATED ART

A MOS semiconductor device having salicide (self-aligned-silicide) structure to be produced with a titanium silicide ($TiSi_2$) film is well known in the art. In such a MOS transistor, a titanium silicide ($TiSi_2$) films are selectively formed both on surfaces of a gate electrode composed of a polysilicon film and diffusion layers, thereby resistances of the diffusion layers and the gate electrode as a wiring are significantly reduced with the result of higher speed operation and higher performances of a semiconductor device.

However, as a semiconductor device have been fabricated in more micro-size, the following phenomena have been found. When arsenic (As) concentration becomes higher in N+ diffusion layers or a gate electrode composed of an N+ polysilicon film, or when patterned ends of the N+ diffusion layers or the gate electrode are much influenced with stress, there occurs delay in phase transition from C49 structure to C54 structure in a $TiSi_2$ film.

In addition, a $TiSi_2$ film is required to be thinner in thickness in order to have a shallower PN junction. Thus, if a $TiSi_2$ film is thin in thickness, the $TiSi_2$ film would agglomerate when subject to rapid thermal annealing. As a result, a finely patterned $TiSi_2$ film comes to have a higher resistance.

In order to overcome such problems as mentioned above, there has been suggested a MOS semiconductor device having salicide structure to be produced with a $CoSi_2$ film which would have a lower resistance than a $TiSi_2$ film even when finely patterned. For instance, Antonio C. Berti et al. "A Manufacturable Process for the Formation of Self Aligned Cobalt Silicide in a Sub Micrometer CMOS Technology", Proceeding of 1992, VLSI Multilevel Interconnection Conference, pp. 267–273 has suggested a salicide-structured MOS semiconductor device including a $CoSi_2$ film. Hereinbelow is explained a method of fabricating an n-channel MOS transistor, having been suggested in the above mentioned report, with reference to FIGS. 1A to 1C which are cross-sectional views of a semiconductor device showing respective step of the method.

Figure 1A:
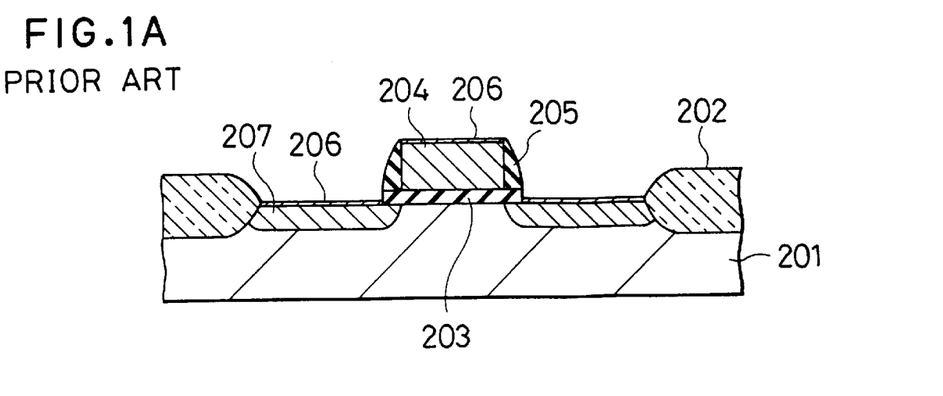
FIGS. 1A to 1C are cross-sectional views of a semiconductor device, showing respective step of a conventional method of fabricating a semiconductor device.

First, as illustrated in FIG. 1A, LOCOS field oxides 202 are formed in device isolation regions on a p-type silicon substrate 201, and a gate oxide 203 having a thickness of 11 nm is deposited by thermal oxidation over device formation region. Then, a non-doped polysilicon film is deposited over a resultant. The polysilicon film is patterned into a gate electrode shape. Then, a TEOS oxide film is deposited over a resultant, and subsequently etched back to thereby form a sidewall spacer 205 around a sidewall of the patterned polysilicon film. As is obvious, the sidewall spacer 205 is composed of the TEOS oxide film. Then, arsenic ion implantation is carried out at a dose of $5.0 \times 10^{15}$ cm$^{-2}$ to thereby form N+ diffusion layers 207 in the device formation regions of the p-type silicon substrate 201 in self-aligning fashion with the sidewall spacer 205. At the same time, the patterned polysilicon film is changed into a gate electrode 204 composed of an N+ polysilicon film, as illustrated in FIG. 1A.

Figure 1B:
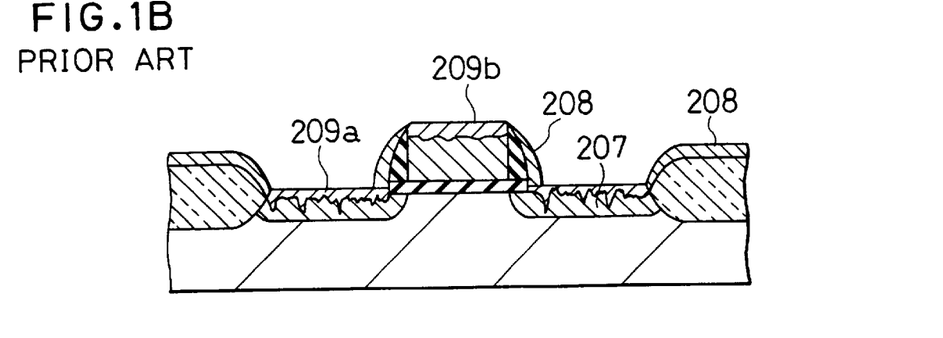

Then, sputtering is carried out to thereby deposit a cobalt film 208 having a thickness of 20 nm all over the silicon substrate 201. Thereafter, a first rapid thermal annealing (RTA) is carried out at about 475° C. in nitrogen atmosphere to thereby form CoSi films 209a and 209b in self-aligning fashion on exposed surfaces of the N+ diffusion layers 207 and the gate electrode 204, respectively. The cobalt films 208 remain unreacted only on exposed surfaces of both the field oxides 202 and the sidewall spacer 205, as illustrated in FIG. 1B.

Figure 1C:
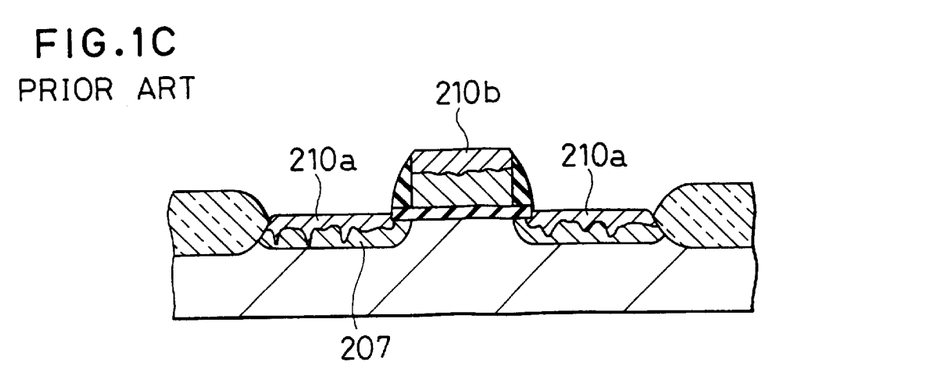

Then, the unreacted cobalt films 208 are selectively removed by wet etching. Then, a second rapid thermal annealing is carried out at 700° C. in nitrogen atmosphere to cause the CoSi films 209a and 209b to change into $CoSi_2$ films 210a and 210b, respectively, as illustrated in FIG. 1C. The thus formed $CoSi_2$ films 210a and 210b have a thickness of about 70 nm. If only a single rapid thermal annealing, for instance, at 700° C. is to be carried out in place of the above mentioned first and second rapid thermal annealings, the $CoSi_2$ films 210a and 210b to be formed on the N+ diffusion layers 207 tend to grow up along the sidewall spacer 205, because silicidation process rapidly proceeds. Accordingly, even if the unreacted cobalt films 208 are selectively removed, it is quite difficult to prevent occurrence of leak between the $CoSi_2$ film grown along the sidewall spacer 205 and the $CoSi_2$ film formed on an upper surface of the gate electrode 204.

Another method of fabricating a salicide-structured MOS semiconductor device having $CoSi_2$ films has been reported in Chih-Shih Wei et al. "Formation of Self-Aligned TiN/$CoSi_2$ Bilayer from Co/Ti/Si and its Applications in Salicide, Diffusion Barrier and Contact Fill", Proceeding of 1990, IEEE VLSI Multilevel Interconnection Conference, pp 233–239. According to the report, a titanium film is formed prior to the deposition of a cobalt film onto a silicon substrate. Then, a resultant is subject to rapid thermal annealing in nitrogen atmosphere. Since titanium atoms migrate in the cobalt film during the rapid thermal annealing, the resultant $CoSi_2$ film is covered at its upper surface with a titanium nitride film. This method provides an advantage that influence exerted by oxygen on an interface between a silicon substrate and a cobalt film can be controlled. This is because oxygen contained in naturally oxidized films having been formed on a silicon substrate is gettered in titanium, and thus the oxygen is able to migrate on an upper surface of the cobalt film together with the titanium.

A salicide-structured MOS semiconductor device having $CoSi_2$ films can prevent higher resistance to be caused in finely formed patterns unlike a salicide-structured MOS semiconductor device having $TiSi_2$ films. However, the above mentioned methods of fabricating a salicide-structured MOS semiconductor device including $CoSi_2$ films have shortcomings as follows.

In the firstly mentioned method (Antonio C. Berti), it is not allowed to disregard the presence of naturally oxidized films 206 (see FIG. 1A). In this method, although wet etching is carried out with hydrofluoric acid prior to the cobalt film sputtering, the silicon substrate 201 are exposed to the atmosphere after the wet etching. Hence, the diffusion layers 207 adsorb oxygen present in the atmosphere, resulting in that the naturally oxidized films 206 are formed on both the diffusion layers 207 and the gate electrode 204, as illustrated in FIG. 1A. If the cobalt film 208 is formed and then the first rapid thermal annealing is carried out with the naturally oxidized films 206 covering the diffusion layers 207 and the gate electrode 204, the N+ diffusion layers 207 and the CoSi films 209a would have a non-uniform or zigzag interface therebetween, as illustrated in FIG. 1B. This is the same in an interface between the gate electrode 204 and the CoSi film 209b. Each of interfaces to be obtained by the second rapid thermal annealing between the N+ diffusion layers 207 and the $CoSi_2$ films 210a cannot avoid to be influenced by the zigzag interfaces having been formed between the N+ diffusion layers 207 and the CoSi films 209a. In addition, the conversion from the CoSi films 209a to the $CoSi_2$ films 210a is accompanied with an increase in volume, and hence an interval between PN junction planes of the N+ diffusion layers 207 and bottom surfaces of the zigzag $CoSi_2$ films 210a is made smaller. Accordingly, there are likely to occur an increase in leak current in PN junctions of the N+ diffusion layers 207 and decreasing of break down voltage of PN junctions.

The secondly mentioned method (Chih-Shih Wei) can resolve the problems caused by the presence of the naturally oxidized films which would occur in the first mentioned method. However, this method includes more essential problems than the firstly mentioned method. In order to deposit a cobalt film, DC magnetron sputtering has been conventionally used. However, cobalt which is ferromagnetic substance prevents stable rotation of a magnet of a sputtering apparatus, resulting in that the sputtering cannot be stably carried out unless cobalt purity in a cobalt target is reduced to thereby weaken magnetic force of cobalt.

In addition, the erosion which would occur on a surface of a cobalt target on sputtering causes magnetic force distribution of a cobalt target to be changed to thereby exert harmful influence on sputtering speed and/or sputtering uniformity with the passage of time. Thus, it is difficult to uniformly form a thin cobalt film having high purity with high reproducibility under control even by the Chih-Shih Wei's method in which titanium and cobalt films are deposited.

As another method of depositing a cobalt film by PVD may be used evaporation to be carried out by heating with an electron gun. However, since electron beams occurring on evaporation would damage a semiconductor device, this method is not suitable to recent MOS semiconductor devices having a thin gate oxide.

SUMMARY OF THE INVENTION

It is an object of the present invention to provide a method of fabricating a semiconductor device by which it is possible to form high purity thin cobalt films having uniform thickness with high reproducibility under control, and to prevent both increased leak current across PN junction in diffusion layers after formation of cobalt disilicide ($CoSi_2$) films and decreasing of break down voltage of PN junction, when a salicide-structured MOS semiconductor device having $CoSi_2$ films therein is to be fabricated.

The present invention provides a method of fabricating a semiconductor device, including the steps of (a) forming a gate electrode in device formation regions on a semiconductor substrate having first conductivity, (b) forming diffusion layers in the device formation regions, the diffusion layers having second conductivity, (c) removing naturally oxidized films having been formed on both the diffusion layers and the gate electrode, in vacuum condition, (d) selectively forming cobalt films on both the diffusion layers and the gate electrode by chemical vapor deposition using gas produced by gasifying cobalt organic compound, (e) carrying out thermal annealing to selectively form cobalt disilicide ($CoSi_2$) films on both the diffusion layers and the gate electrode, the semiconductor substrate being maintained in vacuum condition during the steps (c) to (e), and (f) forming metal wirings in electrical connection with both the diffusion layers and the gate electrode with an interlayer insulating film sandwiched therebetween.

The present invention further provides a method of fabricating a semiconductor device, including the steps of (a) forming a gate electrode in device formation regions on a semiconductor substrate having first conductivity, (b) forming diffusion layers in the device formation regions, the diffusion layers having second conductivity, (c) removing naturally oxidized films having been formed on both the diffusion layers and the gate electrode, in vacuum condition, (d) selectively forming silicon films on both the diffusion layers and the gate electrode, (e) selectively forming cobalt films on the silicon films by chemical vapor deposition using gas produced by gasifying cobalt organic compound, (f) carrying out thermal annealing to selectively form cobalt disilicide ($CoSi_2$) films on both the diffusion layers and the gate electrode, the semiconductor substrate being maintained in vacuum condition during the steps (c) to (f), and (g) forming metal wirings in electrical connection with both the diffusion layers and the gate electrode with an interlayer insulating film sandwiched therebetween.

In the above mentioned methods, the gate electrode is preferably composed of a polysilicon film. The methods may include further step of forming a sidewall spacer around a sidewall of the gate electrode. The sidewall spacer is composed of an insulating film. The sidewall spacer is to be formed between the step of forming the gate electrode and the step of forming the diffusion layers.

The steps of removing naturally oxidized films and selectively forming cobalt films may be carried out in a common vacuum chamber or different vacuum chambers. In the latter case, the semiconductor substrate is transferred from a first vacuum chamber to a second vacuum chamber with being maintained in vacuum condition.

It is preferable to carry out the step of removing naturally oxidized films by using hydrogen containing plasma or by using containing hydrogen fluoride (HF) therein.

The cobalt organic compound may be selected from any one of biscyclopentadienylcobalt ($Co(C_2H_5)_2$), bismethylcyclopentadienylcobalt ($Co(CH_3C_5H_4)_2$), bisacetylacetonatecobalt ($Co(CH_3COCH_3COCH_3)_2$), bisdipivaloylmethanatecobalt ($Co((CH_3)_3CCOCH_4)_2$) and bishexafluoroacetylacetonatecobalt ($Co(C_5HF_6O_2)_2$).

It is preferable to carry out the steps of removing naturally oxidized films and selectively forming silicon oxide films in different vacuum chambers. It is also preferable to carry out the steps of selectively forming silicon oxide films and selectively forming cobalt films in different vacuum chambers. In these cases, the semiconductor substrate needs to be transferred from a vacuum chamber to another vacuum chamber with being maintained in vacuum condition. For instance, the silicon films to be formed on the diffusion layers and the gate electrode may be composed of single crystal silicon and polysilicon, respectively.

As having been described, in the method of the present invention, a gate electrode is formed of a polysilicon film, and then a sidewall spacer composed of an insulating film is formed around the gate electrode. After diffusion layers have been formed, naturally oxidized films formed on surfaces of both the diffusion layers and the gate electrode are removed in vacuum condition such as a vacuum chamber. With the silicon substrate being maintained in vacuum condition, cobalt films are selectively formed both on the diffusion layers and the gate electrode by CVD in which cobalt organic compound is gasified and then the thus produced gas is reduced. Then, RTA is carried out to thereby cause the cobalt films to be silicided.

Thus, the method is not influenced by magnetic field and does not need electron beam radiation unlike PVD such as DC magnetron sputtering, and hence it is possible to form sufficiently thin cobalt films having high purity with high reproducibility under control. This makes it possible to cause interfaces between cobalt disilicide films and diffusion layers to be uniform or flat, resulting in that it is easy to suppress increased leak current across PN junctions of diffusion layers and decreasing of break down voltage of PN junctions.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

With reference to FIGS. 2A to 2D, hereinbelow is explained a method of fabricating a salicide-structured n-channel MOS transistor by using $CoSi_2$ films in accordance with the first embodiment of the present invention.

Figure 2A:
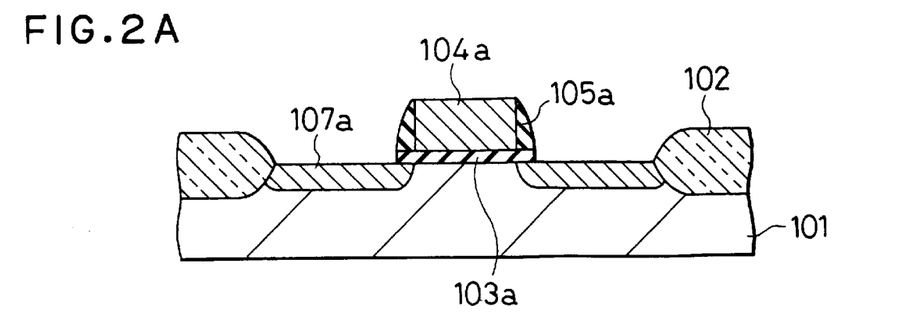
FIGS. 2A to 2D are cross-sectional views of a semiconductor device, showing respective step of a method to be carried out in accordance with the first embodiment of the present invention.

First, as illustrated in FIG. 2A, LOCOS field oxides 102 having a thickness of about 400 nm are formed in device isolation regions on a p-type silicon substrate 101, and a gate oxide 103a having a thickness of 10 nm is deposited by thermal oxidation over device formation region. Then, a non-doped polysilicon film having a thickness of about 250 nm is deposited over a resultant. The thus deposited polysilicon film is patterned into a gate electrode shape. The thus patterned polysilicon film has a width or gate length of about 0.35 $\mu$m in the device formation region. Then, a silicon oxide (HTO) film having a thickness of about 100 nm is deposited over a resultant by high temperature chemical vapor deposition, and subsequently etched back to thereby form a sidewall spacer 105a around a sidewall of the patterned polysilicon film. As is obvious, the sidewall spacer 105a is composed of the HTO oxide film. Then, arsenic (As) ion implantation is carried out at 70 KeV at a dose of 1.0 to 5.0×$10^{15}$ cm$^{-2}$, followed by thermal annealing at 900° C. in nitrogen atmosphere for 15 to 20 minutes to thereby form N+ diffusion layers 107a in the device formation regions of the p-type silicon substrate 101 in self-aligning fashion with the sidewall spacer 105a. At the same time, the patterned polysilicon film is changed into a gate electrode 104a composed of an N+ polysilicon film. The N+ diffusion layers 107a have PN junction depth of about 0.2 $\mu$m.

Following wet etching with hydrofluoric acid, the p-type silicon substrate 101 is introduced into a vacuum chamber (not illustrated). At this stage, there are formed again naturally oxidized films (not illustrated) having a thickness of a few nanometers on exposed surfaces of the N+ diffusion layers 107a and the gate electrode 104a. Then, the p-type silicon substrate 101 is heated up to 300° C. to 600° C., and subsequently exposed to hydrogen plasma having a pressure of 0.3 to 2.6 Pa and power of 0.4 to 1.0 kW to thereby remove the naturally oxidized films having been formed on both the N+ diffusion layers 107a and the gate electrode 104a. It is thought that the naturally oxidized films are removed by being reduced to silicon. Thus, as illustrated in FIG. 2A, exposed surfaces of the N+ diffusion layers 107a and the gate electrode 104a are cleaned.

Figure 2B:
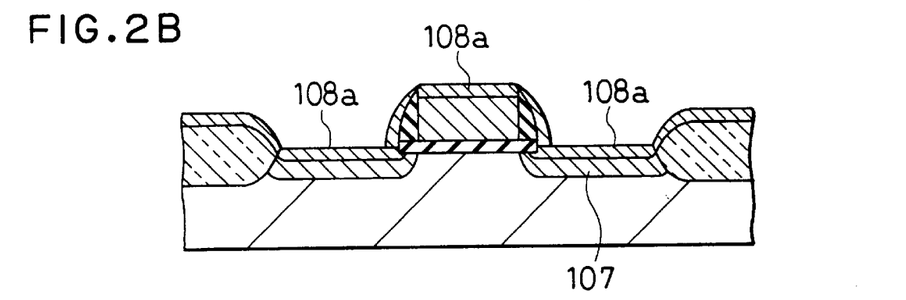

Then, with the silicon substrate 101 being in vacuum condition, there is carried out chemical vapor deposition of cobalt in which hydrogen gas is used as carrier gas and gas obtained by gasifying bishexafluoroacetylacetonate cobalt ($Co(C_5HF_6O_2)_2$) having a fusing point in the range of 172° C. to 174° C. is used as source gas. As a result, cobalt films 108a having a thickness in the range of 20 to 50 nm are selectively formed on the N+ diffusion layers 107a and the gate electrode 104a, as illustrated in FIG. 2B. Since the method is not influenced by magnetic field and does not need electron beam radiation unlike PVD such as the earlier mentioned DC magnetron sputtering, it is possible to form the sufficiently thin cobalt films 108a having high purity with high reproducibility and uniformity under control.

The above mentioned selective CVD causes the gas obtained by gasifying bishexafluoroacetylacetonate cobalt to be reduced with hydrogen gas, and is carried out in the following conditions:

Substrate temperature: 250 to 350° C.

Carrier hydrogen gas flow rate: 40 to 100 sccm

Bishexafluoroacetylacetonate cobalt gasified gas flow rate: 5 to 20 sccm

Pressure: 1.0 to 5.0 Pa

It should be noted that it is not always necessary to carry out the selective CVD of the cobalt films 108a and the removal of the naturally oxidized films with hydrogen plasma in a common vacuum chamber. They may be carried out in different vacuum chambers. However, in such a case, it is necessary for the p-type silicon substrate 101 to be maintained in vacuum condition while being transferred from one vacuum chamber to the other.

The selectivity at growth of the cobalt films 108a can be obtained in dependence on a difference in reduction rate between source gases introduced into silicon surfaces of both the N+ diffusion layers 107a and the gate electrode 104a and source gases introduced into surfaces of silicon oxides of which the field oxides 102 and the sidewall spacer 105a are composed. In addition, the selectivity is greatly dependent on surface conditions of those silicon oxides. In the first embodiment, the silicon oxides 102 and 105a as well as the silicon surfaces of both the N+ diffusion layers 107a and the gate electrode 104a are cleaned with hydrogen plasma prior to the growth of the cobalt films 108a, and in addition, the cobalt films 108a are continuously grown while maintained in vacuum condition. Hence, it is possible to suppress the reduction rate on the silicon oxides, resulting in that high selectivity can be obtained on the growth of the cobalt films 108*a*.

On the other hand, the growth rate of the cobalt films 108*a* is dependent mainly on flow rate ratio of bishexafluoroacetylacetonate cobalt gasified gas to hydrogen gas and pressure of bishexafluoroacetylacetonate cobalt gasified gas. However, the growth rate of the cobalt films 108*a* under the above mentioned growth conditions is relatively low, specifically in the range of 5 to 20 nm, and in addition the reduction rate of cobalt is dependent on hydrogen gas flow rate, thereby the growth rate of the cobalt films 108*a* is scarcely affected by the growth temperature. Accordingly, it is possible to form the thin uniform cobalt films 108*a* with high reproducibility under control. A thickness of the cobalt films 108*a* is determined so that a later mentioned cobalt disilicide ($CoSi_2$) film, which is formed by the entire cobalt films 108*a* being changed thereinto, has a desired thickness. It is easy to control a thickness of a $CoSi_2$ film due to high controllability of a thickness of the cobalt films 108*a*.

Although the gas obtained by gasifying bishexafluoroacetylacetonate cobalt as source gas for the formation of the cobalt films 108*a* is used in the first embodiment, the source gas is not to be limited to that. In place of the above mentioned gas, there may be used any one of gases obtained by gasifying (a) biscyclopentadienylcobalt ($Co(C_2H_5)_2$), (b) bismethylcyclopentadienylcobalt ($Co(CH_3C_5H_4)_2$), (c) bisacetylacetonatecobalt ($Co(CH_3COCH_3COCH_3)_2$) or (d) bisdipivaloylmethanatecobalt ($Co((CH_3)_3CCOCH_4)_2$).

Then, rapid thermal annealing is carried out at 400 to 550° C. for 10 to 30 seconds in a vacuum chamber with the silicon substrate 101 being kept in vacuum condition to thereby cause the cobalt films 108*a* having been formed on surfaces of both the N+ diffusion layers 107*a* and the gate electrode 104*a* to be silicided in self-aligning fashion with the surfaces. As a result, the cobalt films 108*a* are changed into $CoSi_{1+X}$ films ($0 \leq X < 1$). The reason why the rapid thermal annealing is carried out in vacuum condition is to prevent oxidation of surfaces of the cobalt films 108*a*. The $CoSi_{1+X}$ films are mainly composed of CoSi, but includes $CoSi_2$ and $Co_2Si$ and so on.

The rapid thermal annealing may be carried out in the same vacuum chamber as or in a different chamber from a vacuum chamber in which the above mentioned selective CVD or hydrogen plasma cleaning was carried out.

The $CoSi_{1+X}$ films has a uniform thickness ranging from about 40 to about 100 nm. The thickness of the $CoSi_{1+X}$ films is dependent on the growth conditions of the cobalt films 108*a* due to that the naturally oxidized films having been formed on both the N+ diffusion layers 107*a* and the gate electrode 104*a* can be completely removed with hydrogen plasma, and that the sufficiently thin cobalt films 108*a* can be formed with high accuracy and also with uniformity and reproducibility under control. That is, the method in accordance with the first embodiment provides uniform interfaces between the N+ diffusion layers 107*a* and the $CoSi_{1+X}$ films unlike the Antonio C. Berti's method by which the interfaces between the N+ diffusion layers 207 and the CoSi films 209*a* are not uniform, but zigzag, as illustrated in FIG. 1B. In addition, the method in accordance with the first embodiment provides the N+ diffusion layers 107*a* with generally uniform junction depth after the formation of the $CoSi_{1+X}$ films. Furthermore, the embodiment does not need to include a step of removing the unreacted cobalt films 208.

Figure 2C:
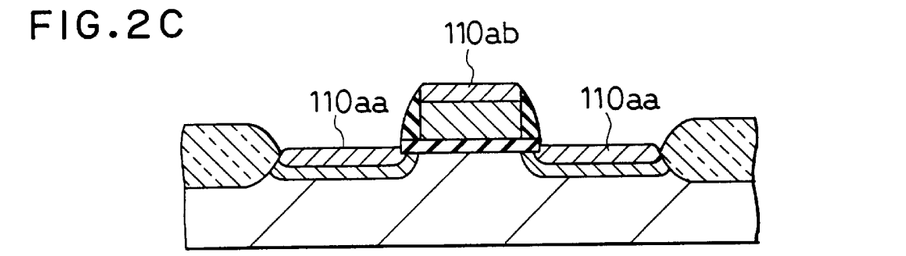

Then, rapid thermal annealing is carried out at 600 to 800° C. for 10 to 30 seconds in vacuum or inert gas atmosphere to thereby convert the $CoSi_{1+X}$ films having been formed on both the N+ diffusion layers 107*a* and the gate electrode 104*a* to $CoSi_2$ films 110*aa* and 110*ab*, respectively, as illustrated in FIG. 2C.

In the present embodiment, although RTA is carried out twice, RTA may be carried out only once. When the cobalt films 108*a* are to be changed into the $CoSi_2$ films 110*aa* and 110*ab* by single RTA, it is necessary to keep the silicon substrate 101 in vacuum condition after the formation of the cobalt films 108*a* until the RTA for silicidation. The $CoSi_2$ films 110*aa* and 110*ab* can have a uniform thickness due to the uniformity of thickness of the $CoSi_{1+X}$ films. Specifically, the $CoSi_2$ films 110*aa* and 110*ab* have a thickness in the range of about 70 to about 165 nm. The N+ diffusion layers 107*a* comes to have uniform junction depth after the formation of the $CoSi_2$ films 110*aa*. Specifically, the junction depth is in the range of about 0.150 to about 0.085 $\mu$m.

Thus, it is easy to suppress increased leak current across PN junction and decreasing of break down voltage of PN junction of the N+ diffusion layers 107*a* in a salicide-structured n-channel MOS transistor fabricated in accordance with the first embodiment.

Figure 2D:
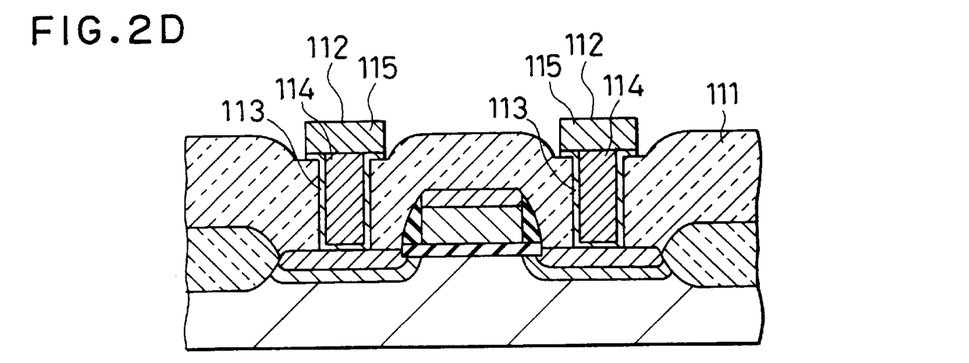

Then, on the p-type silicon substrate 101 is deposited an interlayer insulating film 111 consisting of a silicon oxide film produced by APCVD at about 400° C. and having a thickness of about 100 nm, and a TEOS-BPSG film produced by LPCVD at about 400° C. and having a thickness of about 2 $\mu$m. Then, there are formed through the interlayer insulating film 111 both contact holes 112 having a diameter of about 0.4 $\mu$m and reaching the $CoSi_2$ films 110*aa* having been formed on the N+ diffusion layers 107*a*, and a contact hole (not illustrated) having a diameter of about 0.4 $\mu$m and reaching the $CoSi_2$ films 110*ab* having been formed on the gate electrode 104*a* above the gate oxide 103*a*.

Then, reactive sputtering is carried out to thereby deposit a titanium nitride film 113 which has a thickness in the range of 50 to 100 nm on the interlayer insulating film 111. Then, hydrogen reduction process or silane reduction process is carried out to thereby deposit a tungsten film 114, which is then etched back by reactive ion etching (RIE) or chemical and mechanical polishing (CMP), resulting in that the tungsten film 114 remains unetched to fill the contact holes 112 therewith.

Then, an aluminum alloy film 115 containing copper (Cu) in the range of 0.1 to 0.5 wt % is formed all over a resultant. The aluminum alloy film 115 and the titanium nitride film 113 are patterned into desired wirings so that the patterned aluminum alloy films 115 cover the tungsten films 114 filling the contact holes 112 therewith. Thus, an n-channel MOS transistor in accordance with the embodiment is completed, as illustrated in FIG. 2D.

Though the first embodiment is applied to the formation of an n-channel MOS transistor, the application of the embodiment is not to be limited to that. For instance, the first embodiment can be applied to the formation of an n-channel MOS transistor having LDD-structured n-type diffusion layers, a p-channel MOS transistor or a CMOS transistor.

When the first embodiment is to be applied to the formation of a CMOS transistor, an n-well and further a p-well are formed prior to the formation of the field oxides 102. After the formation of the N+ diffusion layers 107*a*, a region in which an n-channel MOS transistor is to be formed is covered with photoresist, followed by $BF_2$ ion-implantation at 50 KeV at a dose of about 1.0 to about $5.0 \times 10^{15}$ $cm^{-2}$. Then, thermal annealing is carried out by lamp heating at 1000° C. in nitrogen atmosphere for about 10 to about 15 seconds to thereby form P+ diffusion layers. The thus formed P+ diffusion layers have PN junction depth of about 0.2 $\mu$m. Subsequent steps are the same as those of the first embodiment.

For another instance, the first embodiment can be applied to the formation of an emitter electrode of a bipolar transistor having a polysilicon emitter.

With reference to FIGS. 3A to 3D, hereinbelow is explained a method of fabricating a salicide-structured n-channel MOS transistor by using $CoSi_2$ films in accordance with the second embodiment of the present invention. In brief, the second embodiment is different from the first embodiment in that a silicon film is selectively grown prior to both the removal of the naturally oxidized films and selective growth of the cobalt films.

Figure 3A:
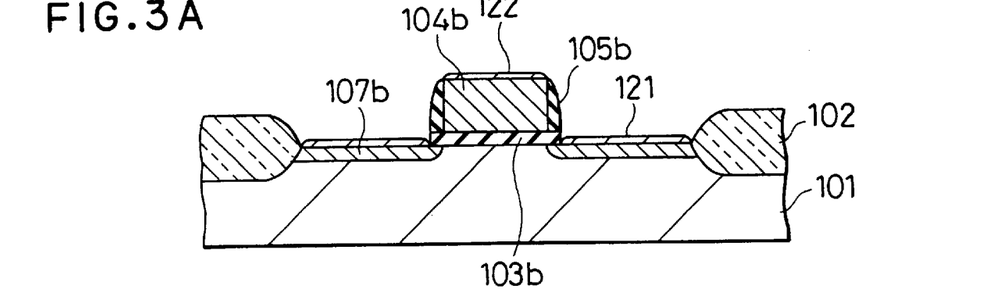
FIGS. 3A to 3D are cross-sectional views of a semiconductor device, showing respective step of a method to be carried out in accordance with the second embodiment of the present invention.

First, as illustrated in FIG. 3A, LOCOS field oxides 102 having a thickness of about 400 nm are formed in device isolation regions, and a gate oxide 103b having a thickness of about 8 nm is deposited by thermal oxidation over device formation region on a p-type silicon substrate 101. Then, a non-doped polysilicon film having a thickness of about 150 nm is deposited all over a resultant. The thus deposited polysilicon film is patterned into a gate electrode shape. The thus patterned polysilicon film has a width or gate length of about 0.25 µm in the device formation region. Then, a silicon oxide (HTO) film having a thickness of about 80 nm is deposited over a resultant by high temperature chemical vapor deposition, and subsequently etched back to thereby form a sidewall spacer 105b around a sidewall of the patterned polysilicon film. As is obvious, the sidewall spacer 105a is composed of the HTO oxide film. Then, arsenic (As) ion implantation is carried out at 50 KeV with a dose of about 1.0 to about $5.0 \times 10^{15}$ $cm^{-2}$, followed by thermal annealing at 900° C. in nitrogen atmosphere for about 15 to about 20 minutes to thereby form N+ diffusion layers 107b on the p-type silicon substrate 101 in self-aligning fashion with the sidewall spacer 105b. At the same time, the patterned polysilicon film is changed into a gate electrode 104b composed of an N+ polysilicon film. The thus formed N+ diffusion layers 107b have PN junction depth of about 0.15 µm.

Following wet etching with hydrofluoric acid, the p-type silicon substrate 101 is introduced into a vacuum chamber (not illustrated). At this stage, there are formed again naturally oxidized films (not illustrated) having a thickness of a few nanometers on exposed surfaces of the N+ diffusion layers 107b and the gate electrode 104b. Then, the p-type silicon substrate 101 is heated up to 25° C. to 100° C., and subsequently exposed to hydrogen fluoride anhydride (HF·0H$_2$O) gas having a certain pressure to thereby remove the naturally oxidized films having been formed on both the N+ diffusion layers 107b and the gate electrode 104b. It is thought that the naturally oxidized films are removed by being reduced to silicon. Thus, as illustrated in FIG. 3A, exposed surfaces of the N+ diffusion layers 107b and the gate electrode 104b are cleaned.

The removal of the naturally oxidized films may be carried out with the same way as the first embodiment. However, it should be noted that the way used in the second embodiment causes less damage to a semiconductor device than the first embodiment, because plasma is not used in the second embodiment for the removal of the naturally oxidized films. The way used in the second embodiment for the removal of the naturally oxidized film may be applied to the first embodiment.

Then, the p-type silicon substrate 101 is transferred to a second vacuum chamber while maintained in vacuum condition. Then, there is carried out the method having been reported by T. Mogami et al., IEDM Technical Digest, pp. 687–690, 1994. Namely, the p-type silicon substrate 101 is heated up to about 660° C., and disilane gas ($Si_2H_6$) at 1 sccm or greater is introduced the second vacuum chamber under certain pressure or vacuum, thereby single crystal silicon films 121 having a thickness ranging from about 20 to about 50 nm and a polysilicon film 122 having a thickness ranging from about 20 to about 50 nm are selectively grown on the N+ diffusion layers 107b and the gate electrode 104b, respectively, as illustrated in FIG. 3A. As explained in the above mentioned report, if a flow rate of the disilane gas is smaller than 1 sccm, the growth rate of the single crystal silicon film 121 on the N+ diffusion layers 107b becomes greater than the growth rate of the polysilicon film 122 on the gate electrode 104b. The reason why the selective growth of the silicon film and the removal of the naturally oxidized films are carried out in different vacuum chambers is to avoid the selective growth of the silicon film from being influenced by residual hydrogen fluoride (HF) gas.

Figure 3B:
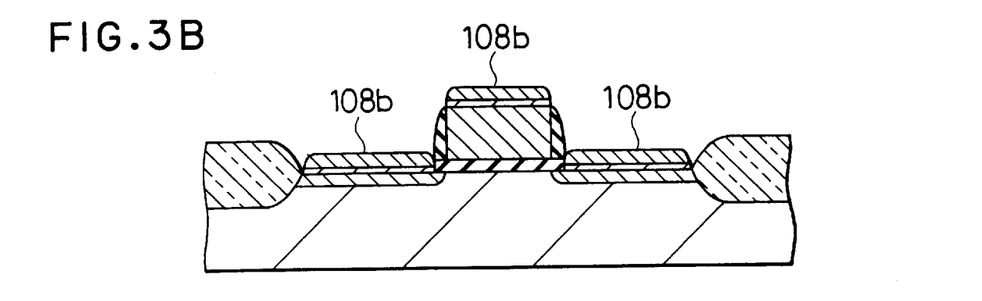

Then, the p-type silicon substrate 101 is transferred to a third vacuum chamber with being kept in vacuum condition. By carrying out the same method as the selective growth of the cobalt films in the first embodiment, there are selectively formed cobalt films 108b having a thickness of about 20 nm on both the single crystal silicon films 121 and the polysilicon film 122, as illustrated in FIG. 3B. Since the method in accordance with the second embodiment is not influenced by magnetic field and does not need electron beam radiation unlike PVD such as the earlier mentioned DC magnetron sputtering, it is possible to selectively form the sufficiently thin cobalt films 108b having high purity with high reproducibility and uniformity under control, similarly to the first embodiment.

It is preferable that the selective growth of the silicon films and the selective growth of the cobalt films are carried out in different vacuum chambers. This is because residue such as residual gas, in particular, carbon containing residue of the selective growth of the cobalt films exerts harmful influence on the selective growth of the silicon films.

Figure 3C:
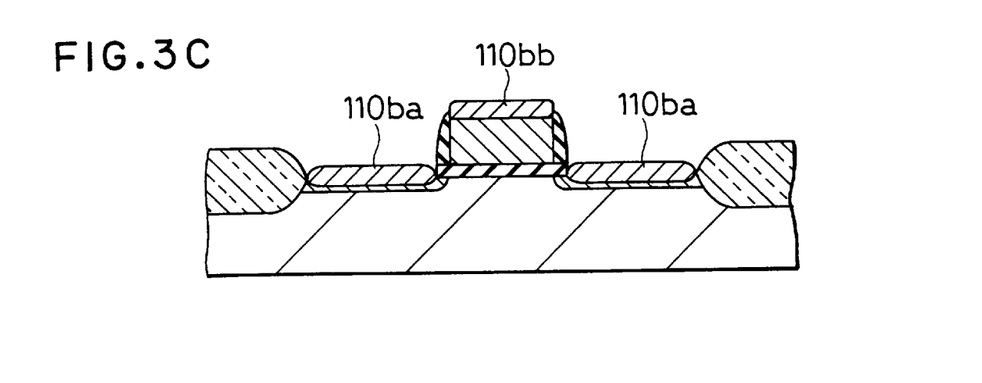

Then, similarly to the first embodiment, rapid thermal annealing is carried out at 400 to 550° C. for about 10 to about 30 seconds in a vacuum chamber with the silicon substrate 101 being maintained in vacuum condition, followed by NCRTA at 600 to 800° C. for about 10 to about 30 seconds in vacuum or inert gas atmosphere, to thereby form the $CoSi_2$ films 110ba and 110bb on surfaces of the N+ diffusion layers 107b and the gate electrode 104b, respectively, as illustrated in FIG. 3C. The formation of the $CoSi_2$ films 110ba and 110bb and the selective CVD of the cobalt films may be carried out in a common vacuum chamber or different vacuum chambers. The $CoSi_2$ films 110ba and 110bb have a thickness of about 70 nm. The N+ diffusion layers 107b comes to have uniform junction depth after the formation of the $CoSi_2$ films 110ba. Specifically, the junction depth is in the range of about 0.12 to about 0.15 µm.

Thus, it is easy to suppress increased leak current across PN junction and decreasing of break down voltage of PN junction of the N+ diffusion layers 107b in a salicide-structured n-channel MOS transistor fabricated in accordance with the second embodiment, similarly to the first embodiment.

Figure 3D:
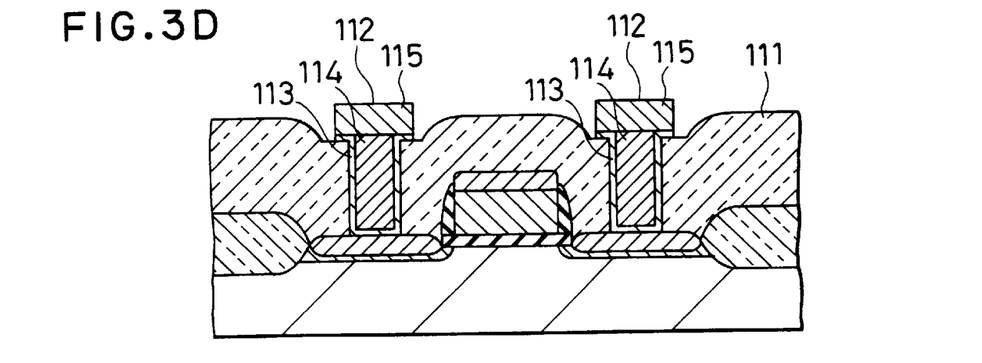

Then, similarly to the first embodiment, on the p-type silicon substrate 101 is deposited an interlayer insulating film 111 consisting of a silicon oxide film produced by APCVD at about 400° C. and having a thickness of about 100 nm, and a TEOS-BPSG film produced by LPCVD at about 400° C. and having a thickness of about 2 µm. Then, there are formed through the interlayer insulating film 111 both contact holes 112 having a diameter of about 0.4 µm and reaching the CoSi$_2$ films 110ba having been formed on the N+ diffusion layers 107b, and a contact hole (not illustrated) having a diameter of about 0.4 μm and reaching the CoSi$_2$ films 110bb having been formed on the gate electrode 104b above the gate oxide 103b.

Then, reactive sputtering is carried out to thereby deposit a titanium nitride film 113 having a thickness in the range of 50 to 100 nm on the interlayer insulating film 111. Then, hydrogen reduction process or silane reduction process is carried out to thereby deposit a tungsten film 114, which is then etched back by reactive ion etching (RIE) or chemical and mechanical polishing (CMP), resulting in that the tungsten film 114 remains unetched to fill the contact holes 112 therewith.

Then, an aluminum alloy film 115 containing copper (Cu) in the range of 0.1 to 0.5 wt % is formed all over a resultant. The aluminum alloy film 115 and the titanium nitride film 113 are patterned into desired wirings so that the patterned aluminum alloy films 115 cover the tungsten films 114 filling the contact holes 112 therewith. Thus, an n-channel MOS transistor in accordance with the second embodiment is completed, as illustrated in FIG. 3D.

The second embodiment provides the same advantageous effect as the first embodiment. In addition, as mentioned earlier, a semiconductor device is less damaged in the second embodiment than in the first embodiment, because the naturally oxidized films are removed by exposing them to hydrogen fluoride anhydride gas in place of hydrogen plasma. Furthermore, the second embodiment includes a step of selective growth of the silicon films prior to selective growth of the cobalt films, and accordingly, the second embodiment makes it easier than the first embodiment to form a more micro-sized semiconductor device, in particular, a semiconductor device having a shallower junction depth.

Though the second embodiment is applied to the formation of an n-channel MOS transistor, the application of the embodiment is not to be limited to that. For instance, the second embodiment can be applied to the formation of an n-channel MOS transistor having LDD-structured n-type diffusion layers, a p-channel MOS transistor or a CMOS transistor, similarly to the first embodiment. For another instance, the second embodiment can be applied to the formation of an emitter electrode of a bipolar transistor having a polysilicon emitter.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A method of fabricating a semiconductor device having a cobalt disilicide film, the method comprising the steps of:
   (a) forming a gate electrode in device formation regions on a semiconductor substrate having first conductivity;
   (b) forming diffusion layers in said device formation regions, said diffusion layers having second conductivity;
   (c) removing naturally oxidized films having been formed on both said diffusion layers and said gate electrode, in a vacuum condition;
   (d) selectively forming cobalt films on both said diffusion layers and said gate electrode by chemical vapor deposition using gas produced by gasifing cobalt organic compound while maintaining said semiconductor device in a vacuum condition;
   (e) carrying out thermal annealing to selectively form cobalt disilicide (CoSi$_2$) films on both a said diffusion layers and said gate electrode while maintaining said semiconductor substrate being maintained in a vacuum condition; and
   (f) forming metal wirings in electrical connection with both said diffusion layers and said gate electrodes with an insulating film sandwiched between said diffusion layers and said gate electrode.

2. The method as set forth in claim 1, wherein said gate electrode is composed of a polysilicon film.

3. The method as set forth in claim 1 further comprising the step (g) of forming a sidewall spacer around a sidewall of said gate electrode, said sidewall spacer being composed of an insulating film, said step (g) being carried out between said steps (a) and (b).

4. The method as set forth in claim 1, wherein said steps (c) and (d) are carried out in a common vacuum chamber.

5. The method as set forth in claim 1, wherein said steps (c) and (d) are carried out in first and second vacuum chambers, respectively, said semiconductor substrate being transferred from said first vacuum chamber to said second vacuum chamber with being maintained in vacuum condition.

6. The method as set forth in claim 1, wherein said step (c) is carried out by using hydrogen containing plasma.

7. The method as set forth in claim 1, wherein said step (c) is carried out by using gas containing hydrogen fluoride (HF) therein.

8. The method as set forth in claim. 1, wherein said cobalt organic compound in said step (d) is selected from the group consisting of biscyclopentadienylcobalt (Co(C$_2$H$_5$)$_2$), bismethylcyclopentadienylcobalt (Co(CH$_3$C$_5$H$_4$)$_2$), bisacetylacetonatecobalt (Co(CH$_3$COCH$_3$COCH$_3$)$_2$), bisdipivaloylmethanatecobalt (Co((CH$_3$)$_3$CCOCH$_4$)$_2$) and bishexafluoroacetylacetonatecobalt (Co(C$_5$HF$_6$O$_2$)$_2$).

9. A method of fabricating a semiconductor device, comprising the steps of:
   (a) forming a gate electrode in device formation regions on a semiconductor substrate having first conductivity;
   (b) forming diffusion layers in said device formation regions, said diffusion layers having second conductivity;
   (c) removing naturally oxidized films having been formed on both said diffusion layers and said gate electrode, in vacuum condition;
   (d) selectively forming silicon films on both said diffusion layers and said gate electrode;
   (e) selectively forming cobalt films on said silicon films by chemical vapor deposition using gas produced by gasifying cobalt organic compound;
   (f) carrying out thermal annealing to selectively form cobalt disilicide (CoSi$_2$) films on both said diffusion layers and said gate electrode, said semiconductor substrate being maintained in vacuum condition during said steps (c) to (f); and
   (g) forming metal wirings in electrical connection with both said diffusion layers and said gate electrode with an interlayer insulating film sandwiched therebetween.

10. The method as set forth in claim 9, wherein said gate electrode is composed of a polysilicon film.

11. The method as set forth in claim 9 further comprising the step (h) of forming a sidewall spacer around a sidewall of said gate electrode, said sidewall spacer being composed of an insulating film, said step (h) being carried out between said steps (a) and (b).

12. The method as set forth in claim 9, wherein said steps (c) and (d) are carried out in first and second vacuum chambers, respectively, said semiconductor substrate being transferred from said first vacuum chamber to said second vacuum chamber with being maintained in vacuum condition.

13. The method as set forth in claim 9, wherein said steps (d) and (e) are carried out in said second vacuum chamber and a third vacuum chamber, respectively, said semiconductor substrate being transferred from said second vacuum chamber to said third vacuum chamber with being maintained in vacuum condition.

14. The method as set forth in claim 9, wherein said step (c) is carried out by using hydrogen containing plasma.

15. The method as set forth in claim 9, wherein said step (c) is carried out by using gas containing hydrogen fluoride (HF) therein.

16. The method as set forth in claim 9, wherein said cobalt organic compound in said step (d) is selected from the group consisting of biscyclopentadienylcobalt ($Co(C_2H_5)_2$), bismethylcyclopentadienylcobalt ($Co(CH_3C_5H_4)_2$), bisacetylacetonatecobalt ($Co(CH_3COCH_3COCH_3)_2$), bisdipivaloylmethanatecobalt ($Co((CH_3)_3CCOCH_4)_2$) and bishexafluoroacetylacetonatecobalt ($Co(C_5HF_6O_2)_2$).

17. The method as set forth in claim 9, wherein said silicon films to be formed on said diffusion layers and said gate electrode are composed of single crystal silicon and polysilicon, respectively.

18. A method of fabricating a semiconductor device having a cobalt disilicide film, the method comprising the steps of:
(a) forming a gate electrode in device formation regions on a semiconductor substrate having first conductivity;
(b) forming diffusion layers in said device formation regions, said diffusion layers having second conductivity;
(c) removing naturally oxidized films having been formed on both said diffusion layers and said gate electrode, in a vacuum condition;
(d) selectively forming cobalt films on both said diffusion layers and said gate electrode by chemical vapor deposition using gas produced by gasifying cobalt organic compound while maintaining said semiconductor device in a vacuum condition;
(e) carrying out thermal annealing to selectively form cobalt disilicide ($CoSi_2$) films on both a said diffusion layers and said gate electrode while maintaining said semiconductor substrate being maintained in a vacuum condition said cobalt disilicide films having a thickness in the range of 70 nm–165 nm; and
(f) forming metal wirings in electrical connection with both said diffusion layers and said gate electrodes with an insulating film sandwiched between said diffusion layers and said gate electrode.

19. A method of forming a semiconductor device according to claim 18, wherein the cobalt disilicide films have a thickness of 70 nm.

\* \* \* \* \*